US012684796B2

(12) United States Patent
Yang

(10) Patent No.: US 12,684,796 B2
(45) Date of Patent: Jul. 14, 2026

(54) HIGH ELECTRON MOBILITY TRANSISTOR AND METHOD FOR FORMING THE SAME

(71) Applicant: UNITED MICROELECTRONICS CORP., Hsin-Chu City (TW)

(72) Inventor: Po-Yu Yang, Hsinchu City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 578 days.

(21) Appl. No.: 17/965,803

(22) Filed: Oct. 14, 2022

(65) Prior Publication Data

US 2024/0097004 A1     Mar. 21, 2024

(30) Foreign Application Priority Data

Sep. 19, 2022    (TW) .................................. 111135320

(51) Int. Cl.
 *H10D 30/47*      (2025.01)
 *H10D 30/01*      (2025.01)
 *H10D 64/27*      (2025.01)
(52) U.S. Cl.
 CPC ......... *H10D 30/015* (2025.01); *H10D 30/475* (2025.01); *H10D 64/411* (2025.01)
(58) Field of Classification Search
 CPC ............... H10D 30/015; H10D 64/311; H10D 64/517–519; H10D 30/475–4755; H10D 64/411
 See application file for complete search history.

(56) References Cited

U.S. PATENT DOCUMENTS

| | | | | |
|---|---|---|---|---|
| 8,163,586 B2 * | 4/2012 | Rey | ..................... | B81C 1/00158 |
| | | | | 257/E21.573 |
| 8,492,261 B2 * | 7/2013 | Van Hove | ......... | H01L 21/28587 |
| | | | | 257/369 |
| 10,354,879 B2 * | 7/2019 | Sriram | ................. | H10D 30/475 |
| 2002/0153537 A1 * | 10/2002 | Segawa | ................ | H10D 64/017 |
| | | | | 257/E21.507 |
| 2012/0168846 A1 * | 7/2012 | Matsui | ................... | H10D 30/68 |
| | | | | 257/316 |
| 2014/0225253 A1 * | 8/2014 | Chen | ...................... | H01L 24/13 |
| | | | | 257/737 |
| 2016/0380091 A1 * | 12/2016 | Okawa | ................. | H10D 62/343 |
| | | | | 257/194 |
| 2018/0151463 A1 * | 5/2018 | Venugopal | ............ | H01L 23/373 |
| 2018/0218910 A1 * | 8/2018 | Harada | ................... | H10D 64/23 |
| 2018/0269282 A1 * | 9/2018 | Yang | ..................... | H10D 62/60 |
| 2021/0336045 A1 * | 10/2021 | Oh | ......................... | H10D 62/343 |
| 2022/0199795 A1 * | 6/2022 | Huang | ................... | H10D 64/62 |
| 2022/0376085 A1 * | 11/2022 | Bothe | .................. | H10D 30/015 |

FOREIGN PATENT DOCUMENTS

CN          111146283 A  *  5/2020

* cited by examiner

*Primary Examiner* — Daniel P Shook
(74) *Attorney, Agent, or Firm* — Winston Hsu

(57) ABSTRACT

A high electron mobility transistor (HEMT) includes a substrate, a channel layer on the substrate, a barrier layer on the channel layer, a gate structure on the barrier layer, a gate spacer on the gate structure, and a gate contact on the gate spacer. The gate contact includes a first portion and a second portion respectively at two sides of the gate spacer and directly contacting the gate structure.

10 Claims, 5 Drawing Sheets

HIGH ELECTRON MOBILITY TRANSISTOR AND METHOD FOR FORMING THE SAME

BACKGROUND OF THE INVENTION

1. Field of the Invention

The present invention relates to a semiconductor device and a method for forming the same. More particularly, the present invention relates to a high electron mobility transistor and a method for forming the same.

2. Description of the Prior Art

A high electron mobility transistor (HEMT) is a new type of field effect transistor which usually includes a hetero-structure including stacked semiconductor layers. By bonding semiconductor layers having different band gaps, the energy band near the heterojunction between the semiconductor layers may bend to form a potential well. The free electrons may converge to the potential well thereby forming a two-dimensional electron gas (2DEG) layer near the heterojunction. The two-dimensional electron gas layer may be utilized as a planar channel region of the high electron mobility transistor. Among the group III-V compound semiconductors, gallium nitride (GaN) based compounds have drawn a lot of attention for having wide band gaps, high breakdown voltages, high bonding strengths, high thermal stabilities, and their unique spontaneous polarization and piezoelectric polarization properties, which allows formation of two-dimensional electron gas layer with high electron concentration and high electron mobility without the needs for additional doping, and an improved witching speed and response frequency may be obtained. GaN based high electron mobility transistors have gradually replaced the silicon based transistors in technical fields such as power converters, low noise amplifiers, radio frequency (RF) or millimeter wave (MMW).

Currently, a GaN based enhancement mode high electron mobility transistor usually includes a heterostructure including p-type GaN/AlGaN/GaN stacked layers. The p-type GaN layer is patterned to form a gate structure. A metal gate contact may be electrically connected to the p-GaN gate structure to apply a gate bias voltage to the p-GaN gate structure to control conducting or cut-off of the two-dimensional electron gas layer. When no gate bias voltage is applied to the p-GaN gate structure, the built-in voltage of the p-GaN gate structure may pull up the energy band between the AlGaN layer and the GaN layer, so that the two-dimensional electron gas layer near the heterojunction between the AlGaN layer and the GaN layer may be depleted and a normally-off operation of the high electron mobility transistor may be provided.

However, the existing GaN based enhancement mode high electron mobility transistors still have some problems need to be solved. For example, during operation, the strong electric field formed in the p-type GaN gate may induce hot carrier bombardment, causing defects to accumulate at the junction between the p-GaN gate and the metal gate contact. After a period of time, the defects may turn into a conductive percolation path and cause serious gate leakage, degrading the device performance and reliability.

SUMMARY OF THE INVENTION

The present invention is directed to provide an enhanced mode high electron mobility transistor (HEMT) and a method for forming the same, which may resolve the above problems.

One embodiment of the present invention provides a high electron mobility transistor, which includes a substrate, a channel layer disposed on the substrate, a barrier layer disposed on the channel layer, a gate structure disposed on the barrier layer, a gate spacer disposed on the gate structure, and a gate contact disposed on the gate spacer and comprising a first portion and a second portion respectively at two sides of the gate spacer and directly contacting the gate structure.

Another embodiment of the present invention provides a method for forming a high electron mobility transistor, which includes the steps of providing a substrate, forming a channel layer on the substrate and a barrier layer on the channel layer, forming a gate structure on the barrier layer, forming a passivation layer on the barrier layer and covering the gate structure, forming a first opening and a second opening in the passivation layer directly over the gate structure, forming a conductive layer on the passivation layer and completely filling the first opening and the second opening, and patterning the conductive layer to form a contact structure.

The HEMT provided by the present invention particularly includes a gate spacer on the gate structure to divide the region of the gate structure being contacted by the contact structure into a first contact region and a second contact region. In this way, the strength of the electric field in the gate structure may be reduced and fewer hot carriers may be generated.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1, FIG. 2, FIG. 4 and FIG. 6 are cross-sectional views of the high electron mobility transistor.

FIG. 3 is a plane view of the high electron mobility transistor at the step shown in FIG. 2.

FIG. 5 is a plane view of the high electron mobility transistor at the step shown in FIG. 4.

DETAILED DESCRIPTION

Figure 1:
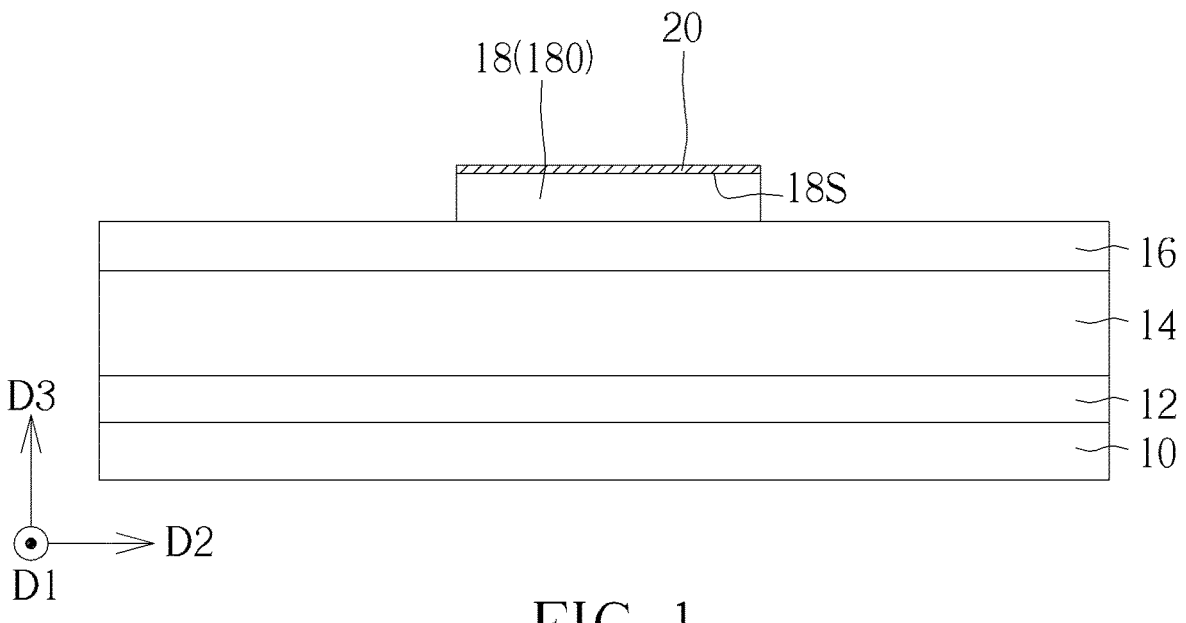
FIG. 1 to FIG. 6 are schematic diagrams illustrating the manufacturing steps of a high electron mobility transistor according to a first embodiment of the present invention.

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

The accompanying drawings are schematic drawings and included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

It will be understood that when an element or layer is referred to as being "on" or "connected to" another element or layer, it may be directly on or directly connected to the other element or layer, or intervening elements or layers may be presented. In contrast, when an element is referred to as being "directly on" or "directly connected to" another element or layer, there are no intervening elements or layers presented.

The terms "wafer" and "substrate" used herein include any structure having an exposed surface onto which a layer is deposited according to the present invention, for example, to form the circuit structure. The term substrate is understood to include semiconductor wafers, but is not limited thereto. The term substrate is also used to refer to semiconductor structures during processing, and may include other layers that have been fabricated thereupon.

FIG. 1 to FIG. 6 are schematic diagrams illustrating the manufacturing steps of a high electron mobility transistor according to a first embodiment of the present invention. Please refer to FIG. 1, a substrate 10 is provided. A hetero-epitaxial stack layer is then formed on the substrate 10. The hetero-epitaxial stack layer may include, from bottom to top, a buffer layer 12, a channel layer 14, a barrier layer 16, and a gate material layer 180. Subsequently, a patterning process (such as a photolithography etching process) is performed to pattern the gate material layer 180 into a gate structure 18. Spatial directions D1, D2 and D3 are shown in the drawings of the present invention for reference for the sake of better understanding the arrangement of the components of the high electron mobility transistor. Directions D1 and D2 are perpendicular to each other and are along the surface of the substrate 10. Direction D3 is vertical to the surface of the substrate 10. According to an embodiment of the present invention, in the plane view, the gate structure 18 has a length extending along the direction D1 and a width W4 along the direction D2 (shown in FIG. 3, the dashed lines labeled as 18a and 18b represent the sidewalls of the gate structure 18). In some embodiments, an etching stop layer 20 may be formed on the gate material layer 180 before patterning the gate material layer 180. Therefore, the top surface 18s of the gate structure 18 is covered by the remaining portion of the etching stop layer 20.

The substrate 10 may be a silicon substrate, a silicon carbide (SiC) substrate, a sapphire substrate, a gallium nitride (GaN) substrate, an aluminum nitride (AlN) substrate, or a substrate made of other suitable materials, but is not limited thereto. The buffer layer 12, the channel layer 14, and the barrier layer 16 may respectively include a single layer or multi layers. The buffer layer 12, the channel layer 14, and the barrier layer 16 may respectively include a III-V compound semiconductor material, such as *allium* nitride (GaN), aluminum gallium nitride (AlGaN), graded aluminum gallium nitride (graded AlGaN), aluminum indium nitride (AlInN), indium gallium nitride (InGaN), aluminum gallium indium nitride (AlGaInN), doped gallium nitride (doped GaN), aluminum nitride (AlN), or a combination thereof, but is not limited thereto. According to an embodiment of the present invention, the buffer layer 12 includes aluminum gallium nitride (AlGaN), the channel layer 14 includes *allium* nitride (GaN), and the barrier layer 16 includes aluminum gallium nitride (AlGaN).

The gate structure 18 (the gate material layer 180) may be made of a semiconductor material, such as e n-type doped III-V compound semiconductor material, n-type doped II-VI compound semiconductor material, undoped III-V compound semiconductor material, undoped II-VI compound semiconductor material, p-type doped III-V compound semiconductor material, or p-type doped II-VI compound semiconductor material, but is not limited thereto. According to an embodiment of the present invention, the material of the gate structure 18 includes p-type gallium nitride (p-GaN) that includes dopants such as magnesium (Mg), iron (Fe), or other suitable p-type dopants.

The etching stop layer 20 is made of a dielectric material, such as aluminum nitride (AlN), aluminum oxide ($Al_2O_3$), boron nitride (BN), silicon nitride (SiN), silicon oxide ($SiO_2$), zirconia ($ZrO_2$), hafnium oxide ($HfO_2$), lanthanum oxide ($La_2O_3$), lutetium oxide ($Lu_2O_3$), lanthanum oxide ($LaLuO_3$), high-k dielectric materials, other suitable dielectric materials, or a combination thereof, but is not limited thereto. According to an embodiment of the present invention, the etching stop layer 20 includes silicon nitride (SiN).

Figure 2:
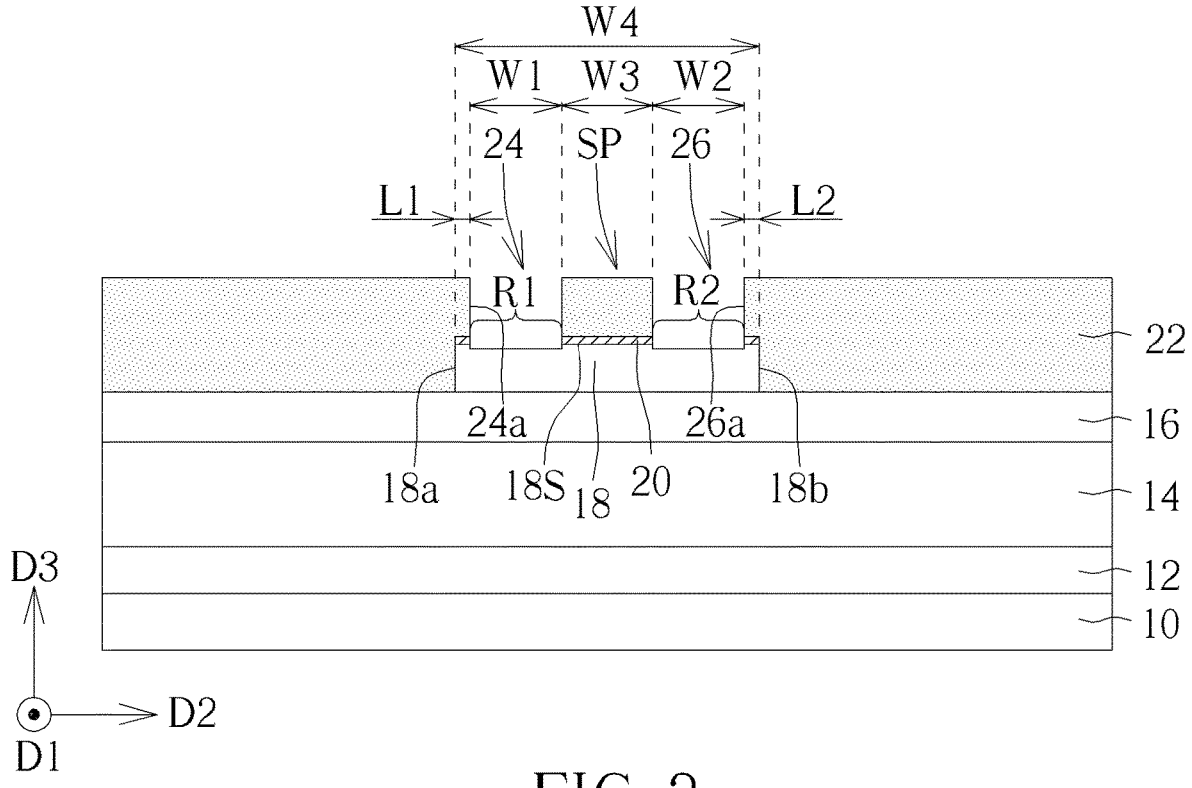
Figure 3:
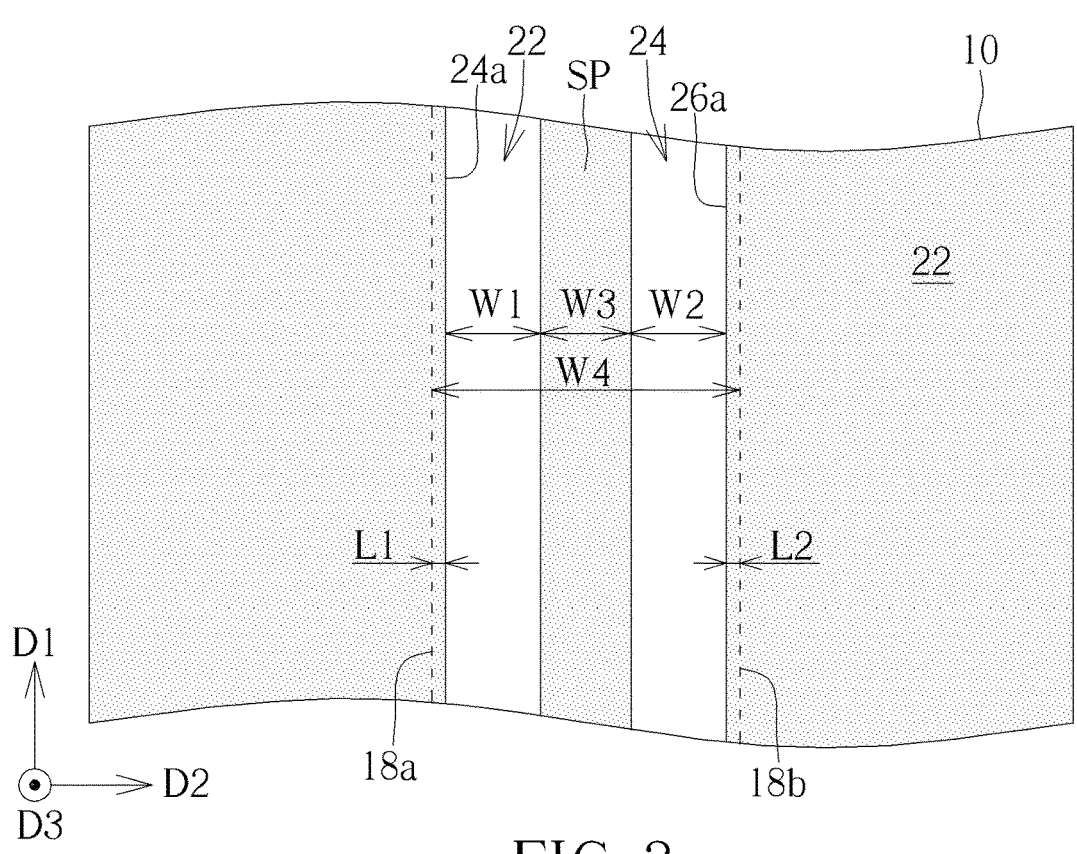

Please refer to FIG. 2 and FIG. 3. Subsequently, a passivation layer 22 is formed on the substrate 10 and covers the barrier layer 16 and the gate structure 18. A patterning process (such as a photolithography etching process) is performed on the passivation layer 22 to form a first opening 24 and a second opening 26 directly above the gate structure 18 and through the passivation layer 22 and the etching stop layer 20 to respectively expose a first contact region R1 and a second contact region R2 of the gate structure 18. The portion of the passivation layer 22 and the etching stop layer 20 between the first opening 24 and the second opening 26 forms a gate spacer SP on the gate structure 18. In the case without forming the etching stop layer 20 on the gate structure 18, the gate spacer SP may be entirely made from the passivation layer 22. The passivation layer 22 may include a single dielectric layer or multiple dielectric layers. The dielectric materials for forming the passivation layer 22 may include silicon oxide (SiO2), silicon nitride (SiN), silicon oxynitride (SiON), aluminum oxide ($Al_2O_3$), aluminum nitride (AlN), boron nitride (BN), zirconia ($ZrO_2$), hafnium oxide ($HfO_2$), lanthanum oxide ($La_2O_3$), lutetium oxide ($Lu_2O_3$), lanthanum oxide ($LaLuO_3$), high-k dielectric materials, organic polymers such as polyimide (PI), benzo-cyclobutene (BCB), polybenzoxazole (PBO), or a combination thereof, but is not limited thereto. According to an embodiment of the present invention, the passivation layer 20 includes silicon oxide ($SiO_2$). According to an embodiment of the present invention, a bottom layer (not shown) of the passivation layer 22 includes aluminum oxide ($Al_2O_3$).

In the plane view as shown in FIG. 3, the first opening 24 and the second opening 26 are slot openings, extending in parallel along the length direction (that is, the direction D1) of the gate structure 18, and respectively have a width W1 and a width W2 along the direction D2. Accordingly, the first contact region R1 and the second contact region R2 respectively exposed from the first opening 24 and the second opening 26 also extend in parallel along the direction D1 and respectively have the width W1 and the width W2 along the direction D2. According to an embodiment of the present invention, the width W1 and the width W2 are the same. A width W3 of the gate spacer SP is determined by the distance between the first opening 24 and the second opening 26 along the direction D2. According to an embodiment of the present invention, the width W3 equals to the width W1 and the width W2.

The outer sidewall 24a of the first opening 24 and the outer sidewall 26a of the second opening 26 may be vertically aligned with the sidewalls 18a and 18b of the gate structure 18, or be pulled back from the sidewalls 18a and 18b toward the gate spacer SP by a distance, respectively. For example, as shown in FIG. 2 and FIG. 3, the outer sidewall 24a of the first opening 24 may be pulled back from the sidewall 18a of the gate structure 18 by a distance L1, and the range of the distance L1 may be between 0 nm and $\frac{1}{10}$ of the width W1 of the first opening 24, but is not limited thereto. The outer sidewall 26a of the second opening 26 may be pulled back from the sidewall 18b of the gate structure 18 by a distance L2, and the range of the distance L2 may be between 0 nm and $\frac{1}{10}$ of the width W2 of the second opening 26, but is not limited thereto. In the case when the distance L1 and the distance L2 are larger than 0 nm, a sum of the width W1 of the first opening 24, the width W2 of the second opening 26, and the width W3 of the gate spacer SP would be smaller than the width W4 of the gate structure 18.

In some embodiments, the first contact region R1 and the second contact region R2 may be over etched by the etching process (such as reactive ion etching process or inductive couple plasma etching process) for forming the first opening 24 and the second opening 26 to ensure that no residual passivation layer 22 or etching stop layer 20 are remained at the bottoms of the first opening 24 and the second opening 26. Accordingly, the first contact region R1 and the second contact region R2 have slightly recessed surfaces, which are not coplanar with the top surface 18a of the gate structure 18 and lower than the bottom surface of the gate spacer SP.

Figure 4:
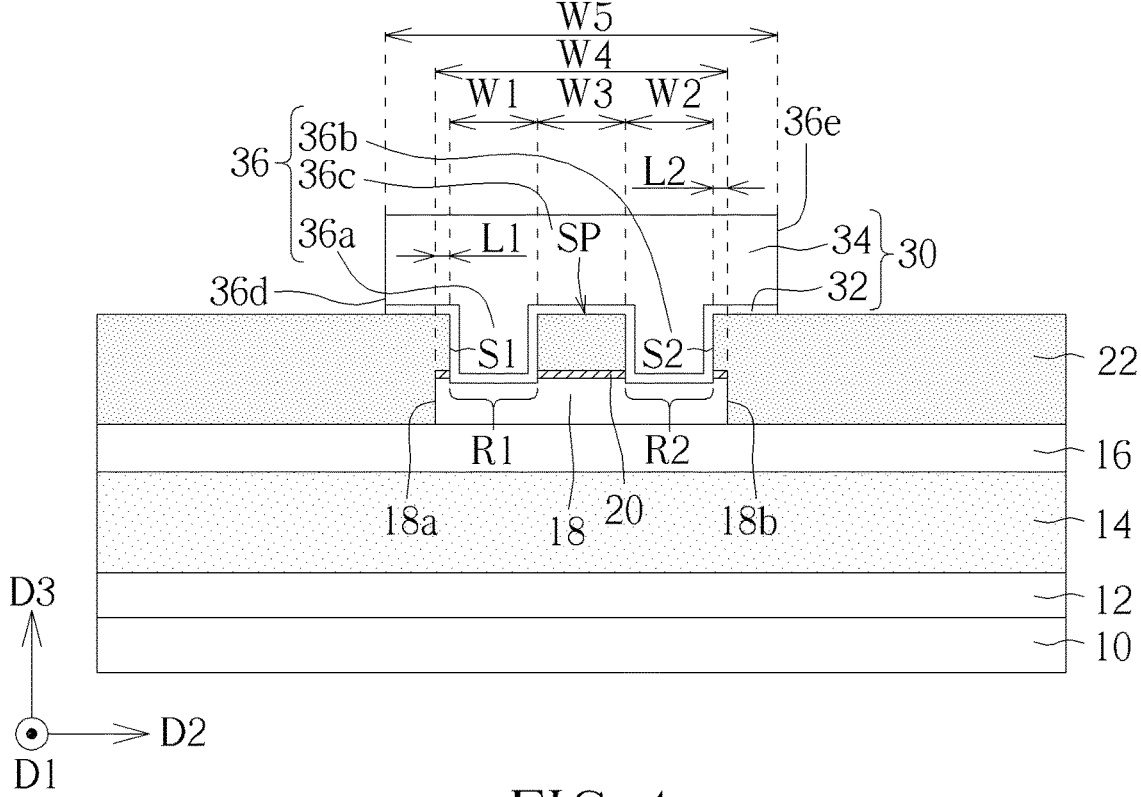
Figures 5, 6:
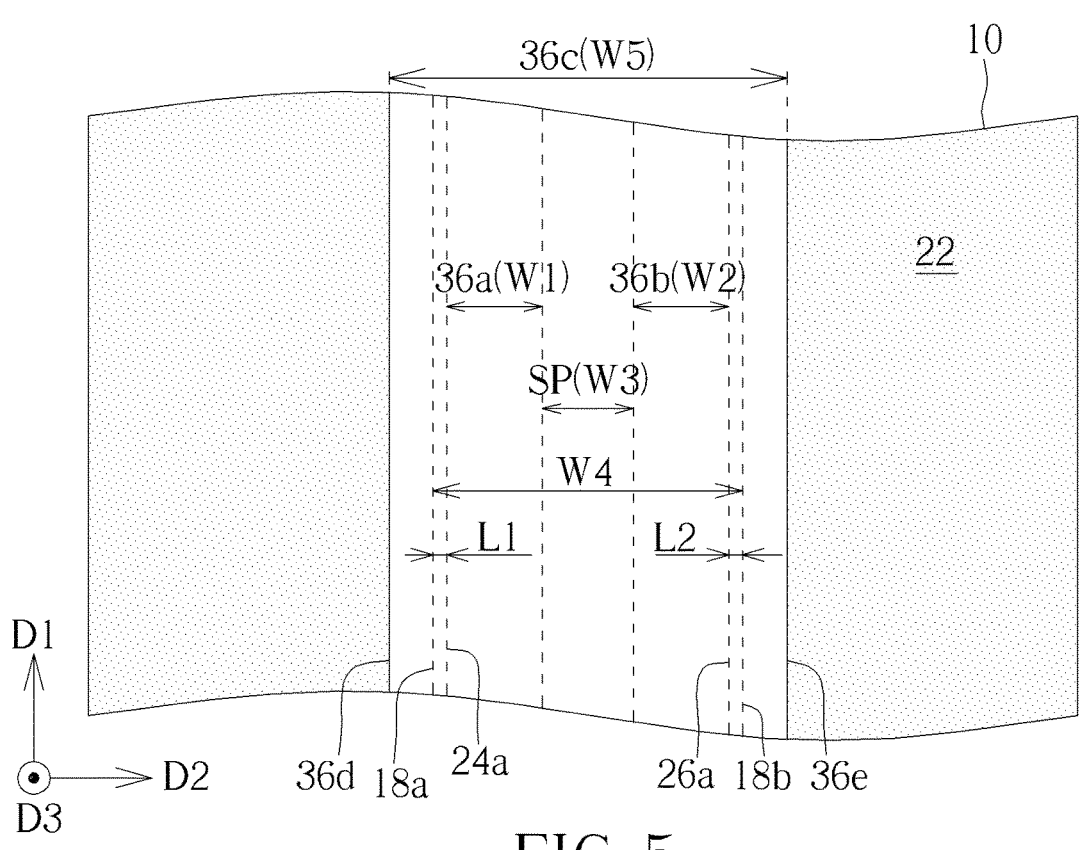

Please refer to FIG. 4 and FIG. 5. Subsequently, a conductive layer 30 is formed on the passivation layer 22 and completely fills the first opening 24 and the second opening 26. A patterning process (such as a photolithography etching process) is performed to remove unnecessary portions of the conductive layer 30, thereby forming a gate contact 36. According to an embodiment of the present invention, the conductive layer 30 may include a liner layer 32 and a metal layer 34. The liner layer 32 is disposed conformal to the passivation layer 22, the first opening 24, and the second opening 26, and directly contacts the gate structure 18. The metal layer 34 is formed on the liner layer 32 and completely fills the first opening 24 and the second opening 26. The material of the liner layer 32 may include titanium (Ti), tantalum (Ta), titanium nitride (TiN), tantalum nitride (TaN), or a combination thereof, but is not limited thereto. The material of the metal layer 34 may include titanium (Ti), molybdenum (Mo), platinum (Pt), chromium (Cr), tungsten (W), nickel (Ni), aluminum (Al), aluminum copper (AlCu), aluminum silicon copper (AlSiCu), copper (Cu), compounds or composite layers or alloys of the above materials, but is not limited thereto. According to an embodiment of the present invention, the liner layer 32 includes titanium nitride (TiN), and the metal layer 34 includes aluminum copper (AlCu).

As shown in FIG. 4, the gate contact 36 has a monolithic structure, including a first portion 36a, a second portion 36b, and a connecting portion 36c. The first portion 36a and the second portion 36b are at two sides of the gate spacer SP, respectively filling the first opening 24 and the second opening 26. The connecting portion 36c is located on the gate spacer SP and the passivation layer 22 and connect between the first portion 36a and the second portion 36b. The first portion 36a is in direct contact with the first contact region R1 of the gate structure 18, and the second portion 36b is in direct contact with the second contact region R2 of the gate structure 18. According to an embodiment of the present invention, by choosing materials of the liner layer 32, the metal layer 34, and the gate structure 18, and/or performing an anneal process, the first portion 36a and the second portion 36b may form a rectifying Schottky contact with the first contact region R1 and the second contact region R2, respectively.

In the plane view as shown in FIG. 5, the first portion 36a and the second portion 36b extend in parallel along the length direction (that is, the direction D1) of the gate structure 18. The width of the first portion 36a is the same as the width W1 of the first opening 24. The width of the second portion 36b is the same as the width W2 of the second opening 26. The connecting portion 36c may have a width W5 along the direction D2. According to an embodiment of the present invention, the width W5 may be larger than the width W4 of the gate structure 18. In the plane view, the sidewalls 36d and 36e of the connecting portion 36c may be located outside the sidewalls 18a and 18b of the gate structure 18. The sidewall S1 of the first portion 36a may be pulled back from the sidewall 18a of the gate structure 18 by the distance L1. The sidewall S2 of the second portion 36b may be pulled back from the sidewall 18b of the gate structure 18 by the distance L2. In this way, the strength of the electric field near the sidewall portions of the gate structure 18 may be reduced, so that gate leakage caused by sidewall parasitic transistors may be prevented.

Please refer to FIG. 6. Subsequently, another passivation layer 23 is formed on the passivation layer 22 and covers the gate contact 36. One or more patterning processes (such as lithography-etching processes) are performed to form a source openings OP1 and a drain opening OP2 at two sides of the gate contact 36, and an opening OP3 directly above the gate contact 36. The source openings OP1 and the drain opening OP2 respectively penetrate through the passivation layer 23, the passivation layer 22, and the barrier layer 16 to expose portions of the channel layer 14. The opening OP3 penetrates through the passivation layer 23 to expose a portion of the gate contact 36. Following, a conductive layer 40 is formed on the passivation layer 23 and completely fills the source openings OP1, the drain opening OP2, and the opening OP3. A patterning process (such as a photolithography etching process) is then performed to remove unnecessary portions of the conductive layer 40, thereby forming a source contact 46S, a drain contact 46D, and a conductive structure 52. According to an embodiment of the present invention, the conductive layer 40 may include a liner layer 42 and a metal layer 44. The liner layer 42 is disposed conformal to the passivation layer 23, the source openings OP1, the drain opening OP2, and the opening OP3, and directly contacts the gate contact 36 and the channel layer 14. The metal layer 44 is formed on the liner layer 42 and completely fills the source openings OP1, the drain opening OP2, and the opening OP3. The materials of the passivation layer 23, the liner layer 42, and the metal layer 44 may be referred to the materials of the passivation layer 22, the liner layer 32, and the metal layer 34, and will not be illustrated herein for the sake of brevity. According to an embodiment of the present invention, the passivation layer 23 includes silicon nitride (SiN). The liner layer 42 includes titanium nitride (TiN), and the metal layer 44 includes aluminum copper (AlCu). According to an embodiment of the present invention, by choosing materials of the liner layer 42 and the metal layer 44, and/or performing an anneal process, the source contact 46S and the drain contact 46D may form a low resistance ohmic contact with the channel layer 14, respectively.

After the step shown in FIG. 6, a high electron mobility transistor 10A according to the first embodiment of the present invention is obtained. The high electron mobility transistor 10A includes a substrate 10, a channel layer 14 disposed on the substrate 10, a barrier layer 16 disposed on the channel layer 14, a gate structure 18 disposed on the barrier layer 16, a gate spacer SP disposed on the gate structure 18, and a gate contact 36 disposed on the gate spacer SP and directly contacting the gate structure 18. The high electron mobility transistor 10A further includes a source contact 46S and a drain contact 46D respectively disposed at two sides of the gate structure 18, penetrating through the barrier layer 16 to directly contact the channel layer 14. A two-dimensional electron gas (2DEG) layer 14a is formed at the junction between the barrier layer 16 and the channel layer 14. The two-dimensional electron gas (2DEG) layer 14a is a planar channel region of the high electron mobility transistor 10A. Through the gate contact 36, a gate bias is applied to the gate structure 18 to control conducting or cut-off of the two-dimensional electron gas layer 14a, thereby realizing ON and OFF switching of the high electron mobility transistor 10A. One feature of the present invention is that, by providing the gate spacer SP on the gate structure 18 to have the gate structure 18 been contacted by the gate contact 36 on the separated first contact region R1 and second contact region R2, so that the strength of the electric field in the gate structure 18 may be reduced and fewer hot carriers may be generated. Gate leakage and reliability degradation caused by hot carrier bombardment may be improved. Since the positions and patterns of the gate spacer SP, the first contact region R1, and the second contact region R2 are defined by patterning the passivation layer 22, the prevent invention may be conveniently applied to conventional enhanced mode high electron mobility transistors having passivation layers.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figures 7, 8:
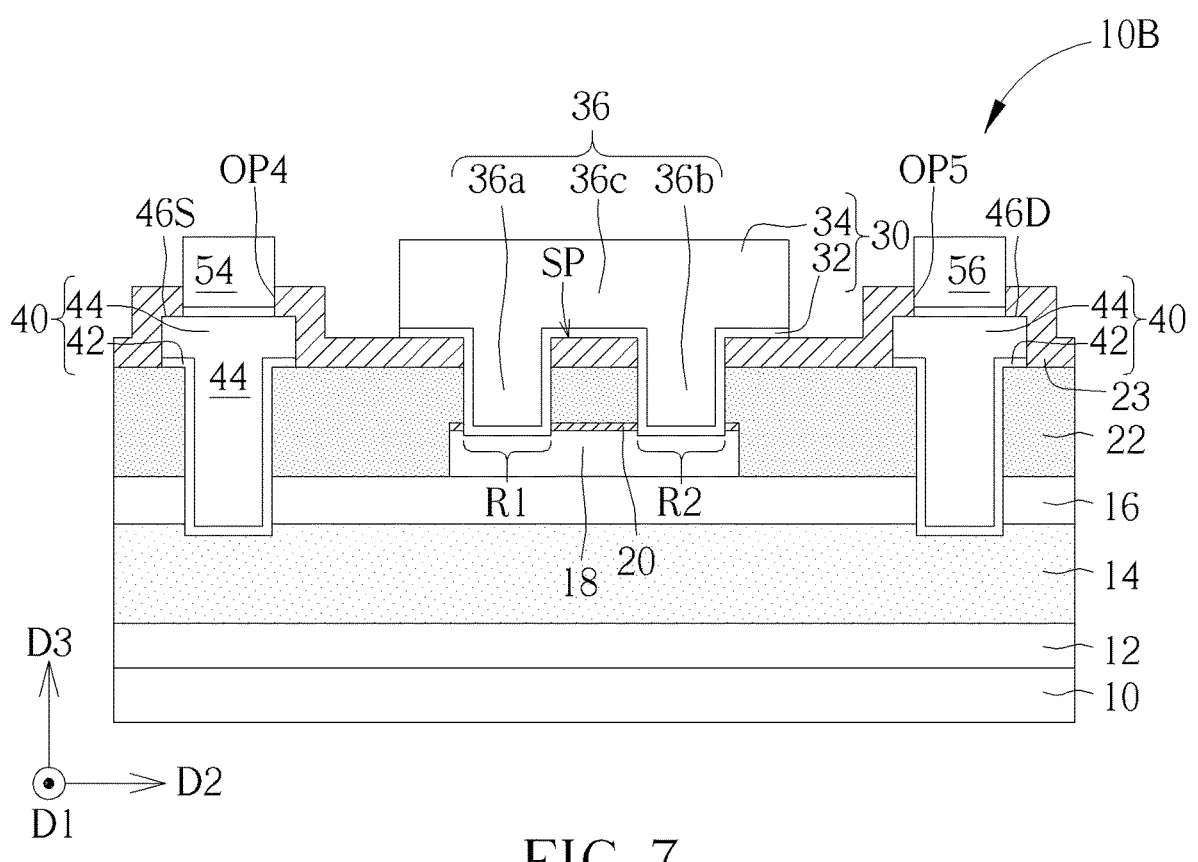
FIG. 7 is a schematic cross-sectional view of a high electron mobility transistor according to a second embodiment of the present invention.
FIG. 8 is a schematic cross-sectional view of a high electron mobility transistor according to a third embodiment of the present invention.

Please refer to FIG. 7, which is a schematic cross-sectional view of a high electron mobility transistor 10B according to a second embodiment of the present invention. A difference between this embodiment and the embodiment shown in FIG. 6 is that the source contact 46S and the drain contact 46D are formed before forming the gate contact 36. For example, after forming the passivation layer 22 on the barrier layer 16 and the gate structure 18, the source contact 46S and the drain contact 46D are then formed at two sides of the gate structure 18, penetrating through the passivation layer 22 and the barrier layer 16 to contact the channel layer 14. Afterward, the passivation layer 23 is formed on the passivation layer 22 and covers the source contact 46S and the drain contact 46D. Following, one or more patterning processes are performed to form the first opening 24 and the second opening 26 directly above the gate structure 18, a fourth opening OP4 directly above the source contact 46S, and a fifth opening OP5 directly above the drain contact 46D. Like the embodiment shown in FIG. 2, the first opening 24 and the second opening 26 penetrates through the passivation layer 23, the passivation layer 22, and the etching stop layer 20, and respectively expose the first contact region R1 and the second contact region R2 of the gate structure 18. Following, the conductive layer 30 is formed on the passivation layer 23 and completely fills the first opening 24, the second opening 26, the fourth opening OP4 and the fifth opening OP5, and then be patterned to form the contact structure 36, the conductive structure 54, and the conductive structure 56 as shown in FIG. 7. In this embodiment, the gate spacer SP includes part of the passivation layer 22 and part of the passivation 23. In the case when the etching stop layer 20 is formed on the gate structure 18, the gate spacer SP further includes part of the etching stop layer 20.

Figure 9:
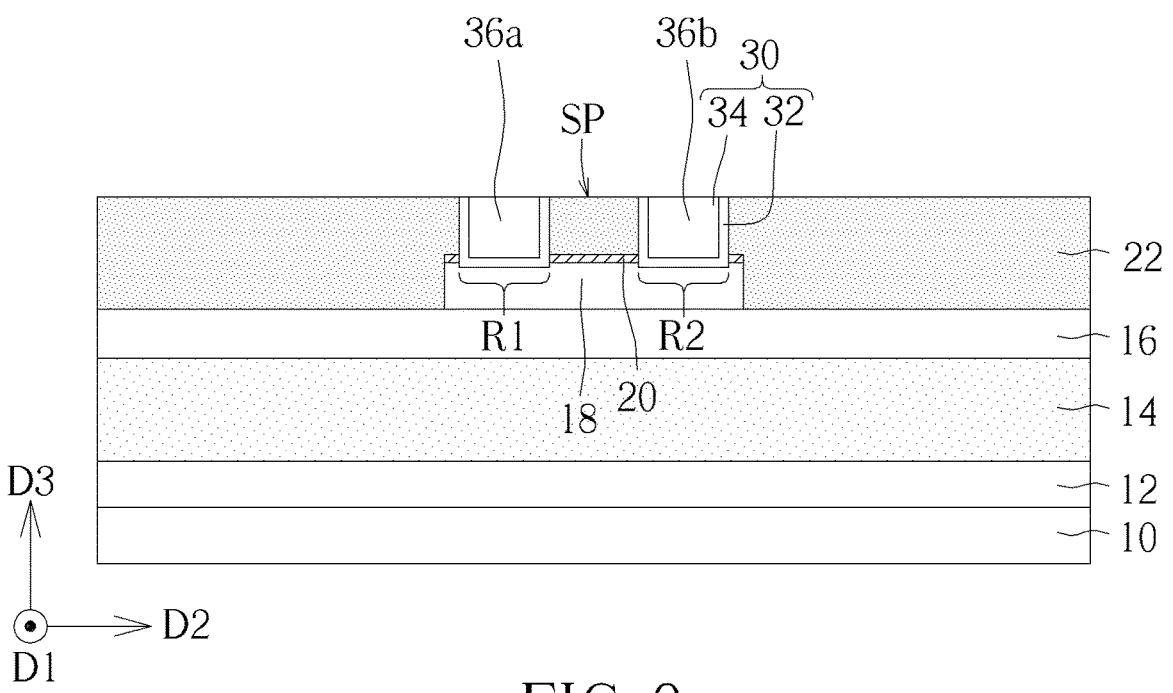
FIG. 9 and FIG. 10 are schematic diagrams illustrating the manufacturing steps of a high electron mobility transistor according to a fourth embodiment of the present invention.
Figure 10:
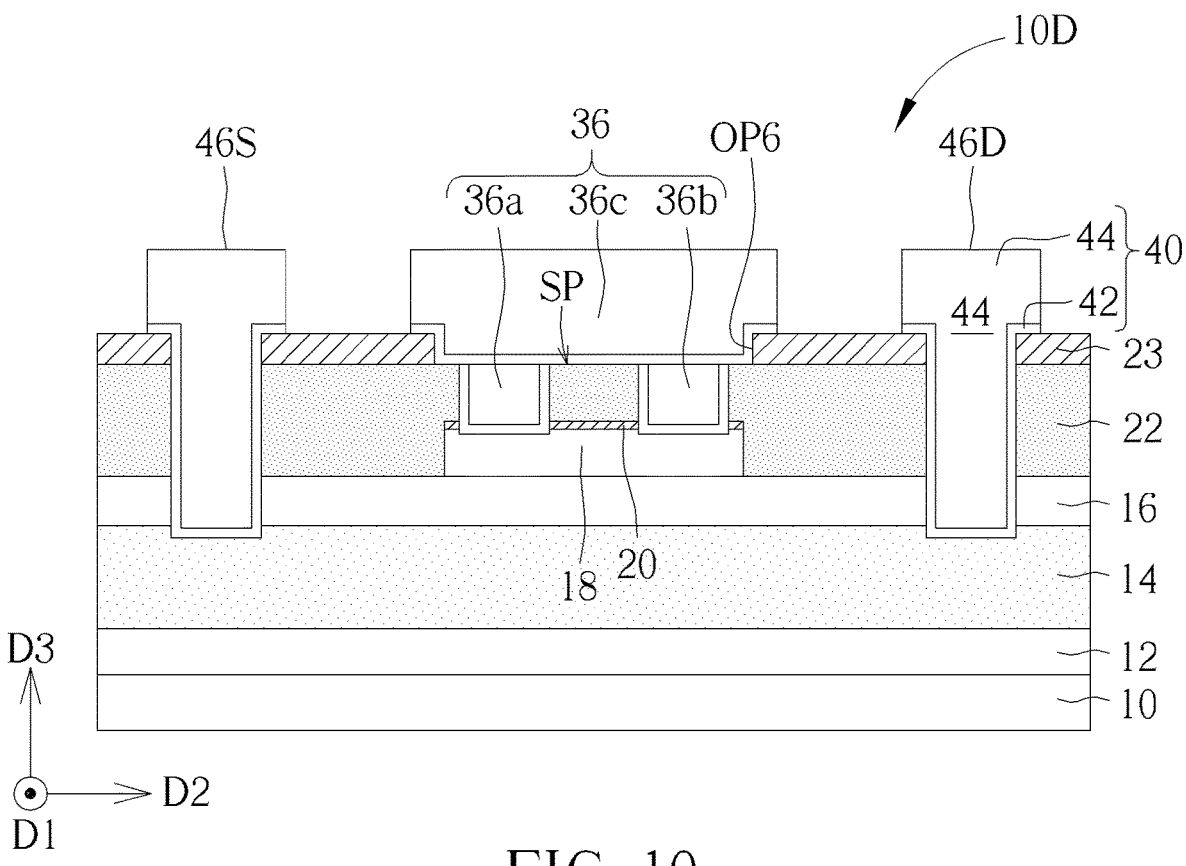

Please refer to FIG. 8, which is a schematic cross-sectional view of a high electron mobility transistor 10C according to a third embodiment of the present invention. A difference between this embodiment and the embodiment shown in FIG. 6 is that the gate contact 36, the source contact 46S, and the drain contact 46D are formed at the same time. For example, after forming the passivation layer 22 on the barrier layer 16 and the gate structure 18, one or more patterning processes are performed to form the first opening 24, the second opening 26, the source opening OP1, and the drain opening OP2. The first opening 24 and the second opening 26 are formed directly above the gate structure 18 and through the passivation layer 22 and the etching stop layer 20 to respectively expose the first contact region R1 and the second contact region R2 of the gate structure 18. The source opening OP1 and the drain opening OP2 are at two sides of the gate structure 18 and penetrate through the passivation layer 22 and the barrier layer 16 to expose portions of the channel layer 14. Following, the conductive layer 30 is formed on the passivation layer 22 and completely fills the first opening 24, the second opening 26, the source opening OP1, and the drain opening OP2, and then be patterned to form the contact structure 36, the source contact 46S, and the drain contact 46D as shown in FIG. 8.

please refer to FIG. 9 and FIG. 10, which are schematic diagrams illustrating the manufacturing steps of a high electron mobility transistor 10D according to a fourth embodiment of the present invention. A difference between this embodiment and the embodiment shown in FIG. 6 is that the first portion 36a, the second portion 36b, and the connecting portion 36c of the gate contact 36 are not integrally formed. For example, as shown in FIG. 9, after forming the conductive layer 30 on the passivation layer 22 and filling the first opening 24 and the second opening 26 (shown in FIG. 2), an etching process or a chemical mechanical polishing process may be performed to remove the conductive layer 30 outside the first opening 24 and the second opening 26, thereby forming the first portion 36a and the second portion 36b respectively at two sides of the gate spacer SP and contacting the first contact region R1 and the second contact region R2. Following, the passivation layer 23 is formed on the passivation layer 22, covering the first portion 36a, the second portion 36b, and the gate spacer SP. One or more patterning processes are performed are then performed to form the source openings OP1 and the drain opening OP2 at two sides of the gate structure 18 and an opening OP6 in the passivation layer 23 directly above the gate structure 18 and expose top surfaces of the first portion 36a and the second portion 36b. Subsequently, the conductive layer 40 is formed on the passivation layer 23 and completely fills the source openings OP1, the drain opening OP2, and the opening OP6, and then be patterned to form the connecting portion 36c, the source contact 46S, and the drain contact 46D.

In conclusion, the present invention is directed to provide an improved high electron mobility transistor, which may reduce the gate leakage by forming a gate spacer on the gate structure to have the gate structure been contacted by the gate contact on two separated first contact region and second contact region, so that the strength of the electric field formed in the gate structure when operating the transistor may be reduced and fewer hot carriers may be generated. Therefore, gate leakage and reliability degradation caused by hot carrier bombardment may be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor, comprising:
a substrate;
a channel layer disposed on the substrate;
a barrier layer disposed on the channel layer;
a gate structure disposed on the barrier layer;
a gate spacer disposed on the gate structure, wherein the gate spacer is made of a dielectric material; and
a gate contact disposed on the gate spacer and comprising a first portion and a second portion respectively at two sides of the gate spacer and directly contacting the gate structure, wherein the gate structure comprises a first Schottky contact region being contacted by the first portion and a second Schottky contact region being contacted by the second portion.

2. The high electron mobility transistor according to claim 1, wherein the first portion comprises a first width, the second portion comprises a second width, the gate spacer comprises a spacer width, the gate structure comprises a gate width, wherein the first width and the second width are the same.

3. The high electron mobility transistor according to claim 2, wherein the first width, the second width, and the spacer width are the same.

4. The high electron mobility transistor according to claim 2, wherein a sum of the first width, the second width, and the spacer width is smaller than the gate width.

5. The high electron mobility transistor according to claim 1, wherein an outer sidewall of the first portion and an outer sidewall of the second portion are pulled back from a sidewall of the gate structure to the gate spacer by a distance, respectively.

6. The high electron mobility transistor according to claim 1, wherein the first Schottky contact region, the second Schottky contact region, and a top surface of the gate structure directly under the gate spacer are not coplanar.

7. The high electron mobility transistor according to claim 1, further comprising:
a passivation layer on the barrier layer and the gate structure, wherein the gate contact further comprises a connecting portion located on the gate spacer and the passivation layer and connecting between the first portion and the second portion; and
a source contact and a drain contact respectively at two sides of the gate structure, penetrating through the passivation layer and the barrier layer to contact the channel layer.

8. The high electron mobility transistor according to claim 7, wherein the first portion, the second portion, and the connecting portion are monolithic in structure.

9. The high electron mobility transistor according to claim 7, wherein the gate spacer and the passivation layer comprise a same dielectric material.

10. The high electron mobility transistor according to claim 1, wherein in a plane view, the first portion, the second portion, and the gate structure extend along a same direction.

* * * * *